(12) United States Patent
Altaf

(10) Patent No.: US 12,320,854 B2
(45) Date of Patent: *Jun. 3, 2025

(54) METHOD FOR ESTIMATING A BATTERY STATE

(71) Applicant: VOLVO TRUCK CORPORATION, Gothenburg (SE)

(72) Inventor: Faisal Altaf, Gothenburg (SE)

(73) Assignee: VOLVO TRUCK CORPORATION, Gothenburg (SE)

(*) Notice: Subject to any disclaimer, the term of this patent is extended or adjusted under 35 U.S.C. 154(b) by 540 days.

This patent is subject to a terminal disclaimer.

(21) Appl. No.: 17/596,363

(22) PCT Filed: Jun. 12, 2019

(86) PCT No.: PCT/EP2019/065337
§ 371 (c)(1),
(2) Date: Dec. 8, 2021

(87) PCT Pub. No.: WO2020/249204
PCT Pub. Date: Dec. 17, 2020

(65) Prior Publication Data
US 2022/0229114 A1 Jul. 21, 2022

(51) Int. Cl.
*G01R 31/389* (2019.01)
*B60L 58/12* (2019.01)
(Continued)

(52) U.S. Cl.
CPC ............ *G01R 31/367* (2019.01); *B60L 58/12* (2019.02); *B60L 58/16* (2019.02); *H02J 7/0047* (2013.01);
(Continued)

(58) Field of Classification Search
CPC .................................................. H02J 7/0048
(Continued)

(56) References Cited

U.S. PATENT DOCUMENTS 11,101,679 B2 * 8/2021 Battle .................. H02J 7/0071
2015/0362559 A1 12/2015 Hametner et al.
(Continued)

FOREIGN PATENT DOCUMENTS

| CN | 104898063 A | 9/2015 |
| CN | 107110916 A | 8/2017 |

(Continued)

OTHER PUBLICATIONS

International Search Report and Written Opinion dated Nov. 18, 2019 in corresponding International PCT Application No. PCT/EP2019/065337, 8 pages.

*Primary Examiner* — Edward Tso
*Assistant Examiner* — Ahmed H Omar
(74) *Attorney, Agent, or Firm* — Venable LLP; Jeffri A. Kaminski

(57) ABSTRACT

A method for estimating a battery state of an energy storage system (200) of a vehicle (201) using at least a dual estimator (301), wherein the energy storage system comprises a battery unit (202), and wherein the dual estimator comprises: a first estimator configured to estimate said battery state using a prediction model, the first estimator having first tuning parameters, a second estimator configured to track changes around nominal values of a set of battery parameters, the second estimator having second tuning parameters, a feedback loop being provided between the first and second estimators, the method comprising: obtaining operational data of the energy storage system, determining whether the operational data fulfil a defined sensitivity criterion with respect to a sensitivity to at least one of the battery parameters, feeding the operational data to the estimators, using the first estimator, estimating the battery state, using the second estimator, for each battery parameter for which the sensitivity criterion is fulfilled, (Continued)

estimating changes around the nominal values of the set of battery parameters.

17 Claims, 3 Drawing Sheets

(51) Int. Cl.
    *B60L 58/16*     (2019.01)
    *G01R 31/367*     (2019.01)
    *G01R 31/392*     (2019.01)
    *H02J 7/00*     (2006.01)

(52) U.S. Cl.
    CPC ......... *H02J 7/0048* (2020.01); *B60L 2200/18* (2013.01)

(58) Field of Classification Search
    USPC ........................................................ 320/132
    See application file for complete search history.

(56) References Cited

U.S. PATENT DOCUMENTS

| | | |
|---|---|---|
| 2016/0209472 A1 | 7/2016 | Chow et al. |
| 2017/0045587 A1 | 2/2017 | Kim et al. |
| 2018/0031639 A1 | 2/2018 | Heiries et al. |
| 2020/0044461 A1* | 2/2020 | Winters ................ H02J 7/0014 |

FOREIGN PATENT DOCUMENTS

| | | |
|---|---|---|
| CN | 107438771 A | 12/2017 |
| CN | 108701879 A | 10/2018 |
| CN | 109153339 A | 1/2019 |
| CN | 113853524 A | 12/2021 |

* cited by examiner

METHOD FOR ESTIMATING A BATTERY STATE

CROSS-REFERENCE TO RELATED APPLICATIONS

This application is a U.S. National Stage application of PCT/EP2019/065337, filed Jun. 12, 2019, and published on Dec. 17, 2020, as WO 2020/249204 A1, all of which is hereby incorporated by reference in its entirety.

TECHNICAL FIELD

The invention relates to a method for estimating a battery state of an energy storage system of a vehicle. The invention further relates to a computer program, a computer readable medium, a control unit, a battery management system, and a vehicle.

BACKGROUND

Energy storage systems (ESS) of electrified vehicles are often based on lithium-ion batteries having complex non-linear dynamics. To be able to efficiently control and manage such an energy storage system, it is crucial to keep track of the battery states of the energy storage system, e.g. its state of health (SoH) and its state of charge (SoC). However, the SoC and the SoH of an energy storage system are not measurable quantities, but rather states which need to be estimated using battery models. A battery management system (BMS) of the ESS therefore needs to be able to accurately estimate battery states as well as various battery parameters, e.g. impedance, open circuit voltage (OCV) and capacity of the ESS. The estimated battery states and battery parameters may then be used by the BMS to e.g. predict the maximum available battery energy and power during driving or charging. These predictions are in turn used to determine e.g. battery load to guarantee safe, optimal and reliable operation of the ESS.

Dual estimators are commonly used for estimating one or more battery states of the ESS based on measured values of operating conditions of the ESS, such as current, voltage and temperature. Such a dual estimator uses coupled double estimators/observers, i.e. estimation schemes, or estimation algorithms, to separately determine on one hand a battery state based on some prediction model, and on the other hand a set of battery parameters. A feedback loop is provided between the estimators, so that the estimated battery state is used in the estimation of the battery parameters and vice versa.

However, measurement data related to operating conditions of the ESS and used as input to dual estimators may not be relevant (i.e., the measurement data does not contain relevant parts of battery dynamic response) for periodically updating estimates of each battery parameter at each time instant. The periodic update based on irrelevant data may in fact lead to divergence and large estimation errors. In addition, the measurement data also normally include a large amount of noise and may need some pre-filtering and post-processing for further smoothing.

There is therefore a need for accurate and more computationally efficient methods for estimating battery states, including strategies for dealing with irrelevant measurement data and measurement noise.

Definitions

The wording "battery unit" should in the following and throughout the entire description be interpreted to also include battery packs, which in themselves may comprise one or more batteries. Still further, the wording "battery unit" should be understood to also include a unit which may comprise a plurality of battery packs. Accordingly, the wording "battery unit" may be a single battery which may comprise a plurality of battery cells, a battery pack which comprises more than a single battery, as well as a module which comprises more than a single battery pack.

By an "estimator" is in the following and throughout the entire description intended an estimation algorithm or estimation scheme or an observer.

The term "battery parameter" should in the following and throughout the entire description be understood as including battery parameters that may be estimated based on a prediction model, such as resistances and capacitances or resistances and time constants of internal voltage losses, open circuit voltage (OCV), and charge/discharge capacity. Thus, the battery parameters are to be understood as parameters of the prediction model used.

SUMMARY

A primary objective of the invention is to provide an in at least some aspect improved method for estimating battery states of an energy storage system (ESS), which method may be used over the lifetime of the ESS and under varying operating conditions. In particular, it is an objective to provide such a method which is computationally efficient and by means of which storage of data may be reduced. Another objective is to provide such a method by means of which the state of charge (SoC) and the state of health (SoH) of the battery may be accurately predicted, regardless of irrelevant measurement data and measurement noise.

According to a first aspect of the invention, at least the primary objective is achieved by a method according to claim 1 for estimating a battery state of an energy storage system of a vehicle using at least a dual estimator, wherein the energy storage system comprises at least one battery unit. The dual estimator comprises:
- a first estimator comprising a first non-linear observer, the first estimator being configured to estimate at least one battery state of the energy storage system using a prediction model, the first estimator having first tuning parameters,
- a second estimator comprising at least one second non-linear observer, the second estimator being configured to estimate a set of battery parameters of the energy storage system by tracking changes around nominal values of said battery parameters, the second estimator having second tuning parameters, a first feedback loop being provided between the first and second estimators so that output from the first estimator is used as input to the second estimator and vice versa.

The method comprises the steps of:
- obtaining operational data of the energy storage system by collecting measurement data relating to operating conditions of the energy storage system,
- determining whether the obtained operational data fulfil a defined sensitivity criterion with respect to a sensitivity of the obtained operational data to at least one of the battery parameters,
- feeding the obtained operational data to the first and the second estimators, respectively,
- using the first estimator, estimating the at least one battery state based on at least the obtained operational data and output from the second estimator, using the second estimator, for each battery parameter for which the sensitivity criterion is fulfilled, estimating a change around the nominal value of said battery parameter based on the obtained operational data and on output from the first estimator.

The proposed dual estimation scheme differs from known dual estimation schemes in that it tracks only fast changes around the nominal values of the set of battery parameters. For example, for the resistance R, the proposed dual estimator tracks the fast change $\Delta R = R - R^*$, wherein $R^*$ is the nominal value, while as previously known dual estimation schemes track total change including both fast and slow variations. In the proposed method, the nominal values may be estimated values, and they may be adapted separately on a slower time-scale.

By checking if the obtained operational data fulfils a defined sensitivity criterion with respect to a sensitivity of the obtained operational data to at least one of the battery parameters, it may be determined whether the obtained operational/measurement data are relevant or not.

Preferably, the method also comprises checking if at least one battery state estimated by the first estimator, such as a state of internal voltage losses, fulfils a defined sensitivity criterion with respect to a sensitivity of the battery state to at least one of the battery parameters. The step of determining whether the obtained operational data and the at least one battery state estimated by the first estimator fulfil a defined sensitivity criterion, is in this embodiment preferably performed by the second estimator.

By defining a sensitivity criterion and testing the obtained operational data, and preferably also at least one internal battery state estimated by the first estimator, such as estimated internal voltage losses, against this criterion, the estimation of a particular battery parameter may be event-triggered instead of time-triggered, i.e. the obtained operational data, and if applicable output from the second estimator, is only used in the estimation of a change around the nominal value of a particular battery parameter if the data is actually found to be sensitive, i.e. relevant, to that parameter. This saves computational power, avoids amplification of measurement noise, and improves the quality of the estimates, since data that are not sensitive to a particular parameter need not be used in the estimation(s). For example, updating of a particular parameter to which the sensitivity of the obtained operational data is found to be below a defined sensitivity threshold may be put on hold until the threshold is exceeded.

Collecting measurement data relating to operating conditions of the ESS comprises measuring temperature, current and voltage of the battery unit or battery units of the ESS. This may be carried out using sensors.

The prediction model used by the first non-linear observer may e.g. be an equivalent circuit model. It is also possible to use e.g. an electrochemical model or a black box model.

The battery units of the ESS are normally managed by a battery management system (BMS), and the method of the present invention may be implemented by the BMS, or by battery management units (BMUs) associated with the individual battery units, or by an energy storage control module (ESCM) of the ESS.

According to one embodiment, the second estimator comprises a plurality of said second non-linear observers, wherein estimating changes around the nominal values of the set of battery parameters comprises using each one of said second non-linear observers to estimate the change around the nominal value of at least one battery parameter from said set of battery parameters. Thus, each of said second non-linear observers is configured to independently estimate at least one battery parameter within said set of battery parameters. This gives a possibility to improve computation efficiency of the method. For example, a full set of parameters may be partitioned into n subsets such that parameters in each subset vary at a similar time-scale. After this partitioning, each second non-linear observer may be used to estimate the changes around the nominal values of each subset of battery parameters, so that if n subsets of parameters are to be estimated, n second non-linear observers are used.

According to one embodiment, at least one of said second non-linear observers is used to estimate the changes around the nominal values of at least two of said battery parameters varying at the same timescale. This separation enables synchronous updating of parameters varying on the same time scale. For example, if one of the non-linear observers is configured to estimate two parameters varying on the same timescale and receives a signal that a sensitivity with respect to one of the parameters is low, it can simply freeze both its parameter estimations without compromising the functionality of the entire dual estimator.

According to one embodiment, the method further comprises:
for each battery parameter for which the sensitivity criterion is not fulfilled, setting a value of said battery parameter to its present value.

Thus, instead of letting the second non-linear observer estimate a new mean value of the battery parameter and its covariance (i.e. uncertainty) based on the operational data, the present mean value of the parameter and its covariance, which were previously estimated, are propagated. Computational power may thereby be saved while robustness of the method is ensured.

According to one embodiment, the method further comprises at least one of the steps of:
adaptively adjusting at least one of the first and the second tuning parameters to account for fast timescale variations of the at least one battery state and/or the set of battery parameters arising due to varying operating conditions of the energy storage system, and
adaptively adjusting the nominal values of the set of battery parameters to account for slow timescale variations arising due to ageing of the at least one battery unit.

The step of adaptively adjusting at least one of the first and the second tuning parameters of the first and second observers, respectively, enables an adjustment of the observers at operating conditions of the energy storage system (ESS) where battery parameters may vary quickly. This adaptation corresponds to self-tuning of the nonlinear observers during run-time of the ESS, thus providing a mechanism to change weights of nonlinear observers compared to using fixed values.

By adaptively adjusting the tuning parameters, accurate estimations of battery states may be provided also at operating conditions at which it is normally difficult to accurately estimate battery states and parameters, such as at low temperatures and low and high SoC levels, respectively. Robustness and performance of the dual estimation scheme is thereby improved under challenging conditions such as extreme SoC or temperature values. Adding this adaptation feature greatly reduces the burden placed on the user of the method, as manual tuning becomes unnecessary.

Preferably, both of the first and the second tuning parameters are adaptively adjusted.

The step of adaptively adjusting the nominal values of the set of battery parameters to account for slow timescale variations arising due to ageing enables accurate estimation of battery states also as the ESS ages. Mismatch between the prediction model used by the first estimator and the actual battery unit(s) of the ESS may thereby be reduced and estimation quality improved.

Preferably, the method comprises both of the steps of adaptively adjusting at least one of the first and the second tuning parameters to account for fast timescale variations and adaptively adjusting the nominal values of the set of battery parameters to account for slow timescale variations. In this way, accurate estimations may be provided over time as well as at varying operating conditions.

According to one embodiment, the step of adaptively adjusting at least one of the first and the second tuning parameters is carried out based on at least the obtained operational data. In general, the adaptation can be achieved either using stochastic analysis of measurement residuals, or using pre-calibrated look-up tables. Using stochastic analysis, the measurement residual is usually generated based on a difference between a measured value and a model-based predicted value of a physical quantity such as voltage, temperature, or current. Using pre-calibrated look-up tables, weights settings are selected online according to battery operating conditions including temperature, current, and state-of-charge.

According to one embodiment, the step of adaptively adjusting the nominal values of the set of battery parameters to account for slow timescale variations comprises the steps of:
storing the obtained operational data from measurements made during at least a defined time horizon to provide a historical data set,
providing output from the dual estimator to the third estimator,
using the third estimator, estimating the nominal value of at least one of the battery parameters based on the historical data set and on the output from the dual estimator,
outputting the estimated nominal value of the at least one battery parameter from the third estimator to the dual estimator.

The dual estimator tracks changes of parameters around the estimated nominal values. In other words, the dual estimator only tracks fast variations arising due to operating conditions whereas slow variations due to ageing are tracked by the third estimator.

The output from the dual estimator to the third estimator may comprise estimated battery state and/or battery parameters, preferably both.

According to one embodiment, the method further comprises downsampling of said output from the dual estimator, wherein said nominal value is estimated based on the downsampled output. The third estimator thus does not need to use all the historical data from dual estimator, thereby reducing computational and memory load. Downsampling may be performed by the third estimator or by the dual estimator, but it is preferably performed by the dual estimator so that communication costs between the dual estimator and the third estimator may be reduced.

According to one embodiment, the estimation of said nominal value using the third estimator is carried out at a lower frequency than the estimations using the dual estimator, such as at a pre-determined lower frequency or after a pre-determined time interval or upon fulfilment of a defined condition. The interval at which the estimation of said nominal value using the third estimator is carried out may be set in dependence on an expected time-scale of the variations arising due to ageing. The interval/frequency may not be constant during the lifetime of the ESS, but may change over time. The less frequent update by the third estimator reduces computational load.

According to one embodiment, the third estimator uses an optimization based estimation scheme, such as a moving horizon estimation model. Also other optimization based scheme may be used, such as total least squares, recursive-least-squares, and variants of other recursive nonlinear observers, etc. The moving horizon estimation model enables optimal estimation of the nominal values.

According to one embodiment, obtaining operational data of the energy storage system further comprises pre-filtering of the collected measurement data to remove high-frequency noise. This makes the estimation more reliable and may reduce some processing load on the first and second observers. The operational data used as input to the dual estimator and, if applicable, to the third estimator, is thus filtered measurement data.

According to one embodiment, at least one of the non-linear observers is a Kalman filter, or a recursive least square method based observer, or a particle filter, or a sliding-mode observer. The Kalman filter may be a variant of a Kalman filter, such as an extended Kalman filter, or a second-order Kalman filter, or a sigma-point Kalman filter, including an unscented type.

In other aspects, the invention relates to a computer program comprising program code means for performing the proposed method when said computer program is run on a computer, a computer readable medium carrying a computer program comprising program means for performing the proposed method when said program means is run on a computer, and a control unit configured to perform the proposed method.

The invention also relates to a battery management system for an energy storage system comprising the proposed control unit, and to a vehicle, such as a hybrid vehicle or a fully electrified vehicle, comprising an energy storage system and the proposed control unit. The vehicle may be in the form of a heavy-duty vehicle such as a bus, a truck or a construction equipment.

BRIEF DESCRIPTION OF THE DRAWINGS

With reference to the appended drawings, below follows a more detailed description of embodiments of the invention cited as examples.

In the drawings.

The drawings are schematic and not necessarily drawn to scale.

DETAILED DESCRIPTION OF EXAMPLE EMBODIMENTS OF THE INVENTION

In the present detailed description, various embodiments of the method according to the present invention are mainly described with reference to an all-electric bus, comprising a propulsion system in the form of battery powered electric motors. However, it should be noted that various embodiments of the described invention are equally applicable for a wide range of hybrid and electric vehicles.

Figure 1:
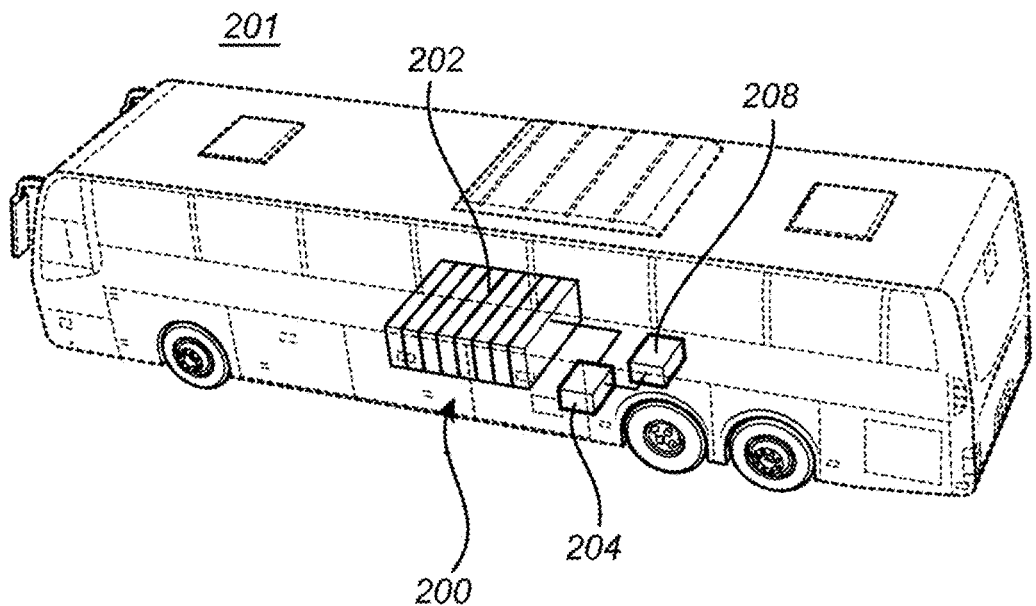
FIG. 1 shows a vehicle in which a method according to the invention may be implemented.

FIG. 1 shows a simplified perspective view of an all-electric vehicle in the form of a bus 201, which according to an embodiment is equipped with an electric machine (not shown) for operating the bus.

The bus 201 carries an electric energy storage system (ESS) 200 comprising a battery pack 202, the battery pack comprising a plurality of battery cells. The battery cells are connected in series to provide an output DC voltage having a desired voltage level. Suitably, the battery cells are of lithium-ion type, but other types may also be used. The number of battery cells per battery pack may be in the range of 50 to 500 cells. It is to be noted that the ESS may include a plurality of battery packs.

A sensor unit (not shown) may be arranged for collecting measurement data relating to operating conditions of the ESS, i.e. measuring temperature, voltage and current level of the associated battery pack 202. Measurement data from each sensor unit is transmitted to an associated battery management unit (BMU) 204, which is configured for managing the individual battery pack 202 during operation of the bus 201. The BMU 204 can also be configured for determining parameters indicating and controlling the condition or capacity of the battery pack 202, such as the state of charge (SoC), the state of health (SoH), the state of power (SoP) and the state of energy (SoE) of the battery pack 202.

The BMU 204 is connected to and configured to communicate with an ESS control unit 208, which controls the ESS. The ESS control unit 208 may include a microprocessor, a microcontroller, a programmable digital signal processor or another programmable device. Thus, the ESS control unit 208 comprises electronic circuits and connections (not shown) as well as processing circuitry (not shown) such that the ESS control unit 208 can communicate with different parts of the bus 201 or with different control units of the bus 201. The ESS control unit 208 may comprise modules in either hardware or software, or partially in hardware or software, and communicate using known transmission buses such a CAN-bus and/or wireless communication capabilities. The processing circuitry may be a general purpose processor or a specific processor. The ESS control unit comprises a non-transitory memory for storing computer program code and data. Thus, the skilled person realizes that the ESS control unit may be embodied by many different constructions. This is also applicable to the BMU 204.

Figure 2:
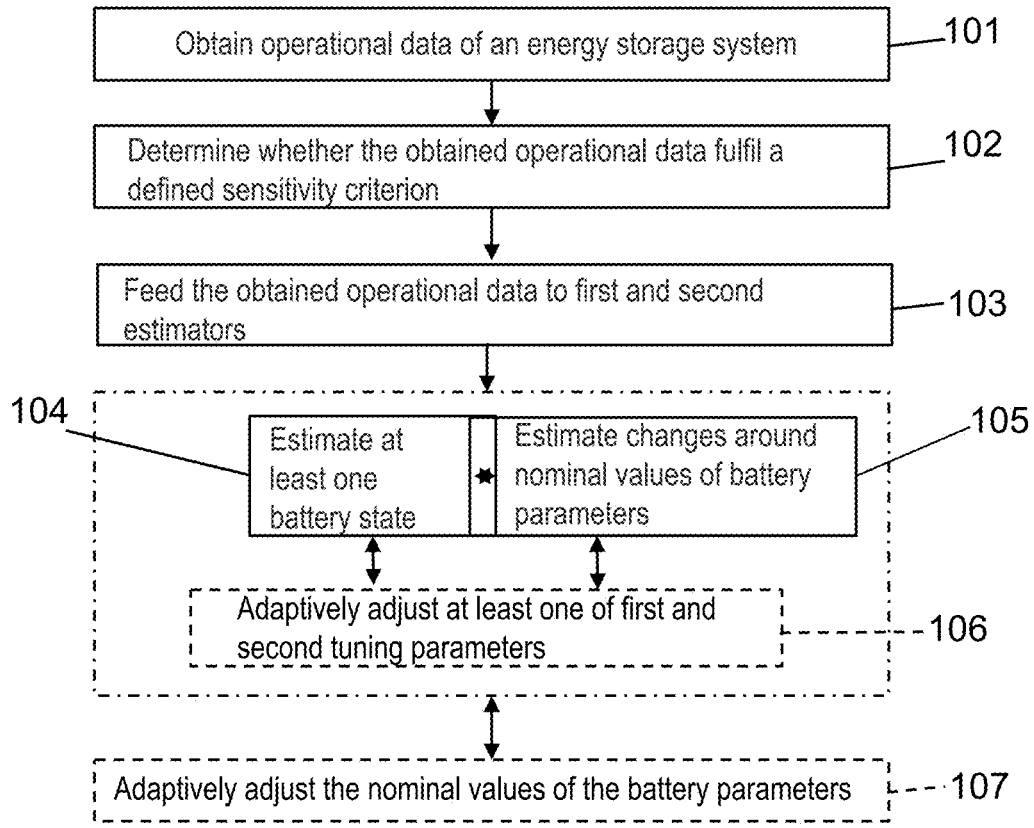
FIG. 2 is a flow-chart illustrating a method according to an embodiment of the invention.
Figure 3:
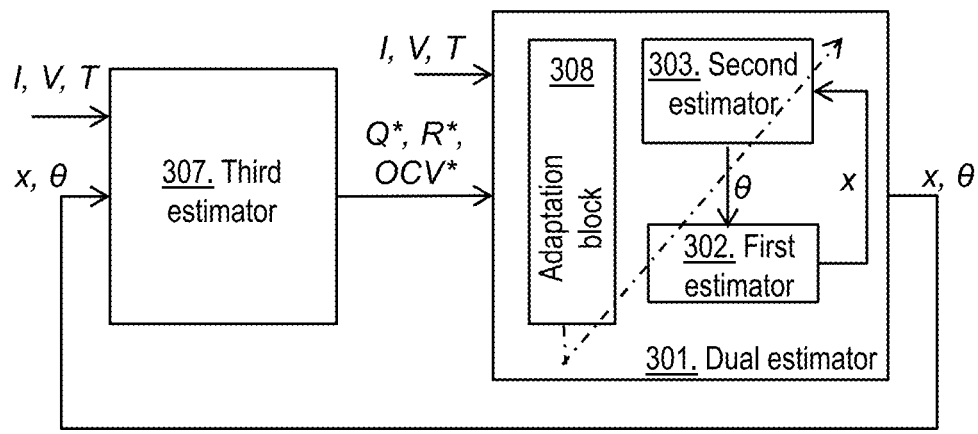
FIG. 3 is a block diagram illustrating an embodiment of the invention.

A method for estimating a battery state of an ESS such as the one illustrated above according to an embodiment of the invention is schematically illustrated in FIG. 2. The steps are carried out repeatedly, such as at a certain time interval, but may not necessarily be carried out in the order shown in FIG. 2. The method steps may in this embodiment be carried out in the ESS control unit 208 or in the BMU 204. Reference is also made to FIG. 3, which is a block model illustrating an implementation of a method according to an embodiment of the invention.

In a first step 101, operational data of the energy storage system are obtained by collecting measurement data relating to operating conditions of the energy storage system, i.e. temperature T, voltage V and current level I of the battery pack 202 of the ESS 200.

In a second step 102, it is determined whether the obtained operational data fulfil a defined sensitivity criterion with respect to a sensitivity of the obtained operational data to at least one of the battery parameters.

In a third step 103, the obtained operational data are fed to a first estimator 302 and a second estimator 303, respectively, forming part of a dual estimator 301. The first estimator 302 comprises a first non-linear observer, such as a Kalman filter or a variant thereof, configured to estimate at least one battery state x of the ESS using a prediction model, the first estimator 302 having first tuning parameters. The second estimator 303 comprises at least one second non-linear observer, such as a Kalman filter or a variant thereof, and is configured to track relatively fast changes around nominal values of a set of battery parameters θ of the ESS, said changes arising due to changes in operating conditions of the ESS. The second estimator 303 has second tuning parameters and may e.g. assume a random walk model for dynamics of the battery parameters.

A first feedback loop is provided between the first and second estimators so that output from the first estimator 302 is used as input to the second estimator 303 and vice versa.

In a fourth step 104, using the first estimator 302, the at least one battery state is estimated based on at least the obtained operational data and output from the second estimator 303 produced in a fifth step 105. The at least one battery state may e.g. be a state of charge (SoC), a state of internal voltage losses, or states relating to those.

In the fifth step 105, using the second estimator 303, changes around the nominal values of the set of battery parameters are estimated based on at least the obtained operational data and output from the first estimator produced in the fourth step 104. The set of battery parameters may herein be the parameters of the prediction model used by the first estimator. In case an equivalent circuit model is used, the battery unit may be modelled as an ohmic resistor having an internal resistance $R_0$, and a series of n resistor-capacitor (RC) sub-circuits having resistances $R_i$ and capacitances $C_i$, wherein i=1, ..., n, n being an integer number, e.g. n=2. Time constants of the RC branches may be expressed as $\tau_i = R_i(t) C_i(t)$. The set of battery parameters are in this case described by a time dependent vector $\theta(t)=[R_0(t), R_i(t), C_i(t), r_i(t)]$ and the battery state SoC is described by a time dependent vector $x(t)=[V_i(t), z(t)]$, $V_i(t)$ being the voltage drop across each RC branch, i.e. internal voltage losses, and $z(t)=\eta/Q^*I(t)$, where η is the battery's coulombic efficiency, Q is battery's total capacity, and I(t) is the current supplied to the battery. The time dependent parameter vector θ(t) may also include Q(t) and OCV(t).

The fourth step 104 and the fifth step 105 are carried out repeatedly, such as at a predetermined frequency, and output from the first estimator 302 is fed to the second estimator 303 and vice versa.

In an optional sixth step 106, at least one of the first and the second tuning parameters is adaptively adjusted to account for fast timescale variations of the at least one battery state and/or the set of battery parameters, said fast timescale variations arising due to varying operating conditions of the energy storage system. The main tuning parameters using Kalman filters as the first and second non-linear observers are the covariance matrices, including the state process noise covariance $\Sigma_w$ and the measurement noise covariance $\Sigma_y$, and the parameter process noise $\Sigma_f$. Adaptively adjusting the tuning parameters may thus comprise adapting the covariance matrices at every time step of the method.

In an optional seventh step 107, the nominal values of the set of battery parameters, such as the nominal values Q*, R*, OCV* of the capacity Q, the resistance R and the open circuit voltage OCV, are adaptively adjusted to account for slow timescale variations arising due to ageing of the at least one battery unit, corresponding to an estimation of the battery SoH. This may comprise using a third estimator 307 comprising a third non-linear observer, wherein a second feedback loop is provided between the dual estimator 301 and the third estimator 307, so that output from the dual estimator 301 is used as input to the third estimator 307 and vice versa. The seventh step 107 may comprise the sub-steps of:

storing the obtained operational data from measurements made during at least a defined time horizon to provide a historical data set, providing output from the dual estimator 301 to the third estimator 307, using the third estimator 307, estimating the nominal value of at least one of the battery parameters based on the historical data set and on the output from the dual estimator 307, outputting the estimated nominal value of the at least one battery parameter from the third estimator 307 to the dual estimator 301.

The sub-steps may not necessarily be carried out in this order.

The seventh step 107 may also comprise the sub-step of downsampling of said output from the dual estimator 301, wherein said nominal value is estimated based on the downsampled output. Downsampling may be achieved by averaging of x(t) and θ(t) over certain sub-intervals within a defined time horizon. These sub-intervals are defined by splitting a given time horizon into various segments.

The method may comprise either one of the sixth and seventh steps 106, 107, or preferably both of the sixth and seventh steps.

FIG. 3 is a block model illustrating an implementation of a method according to an embodiment of the invention. A dual estimator 301 as described above is provided, comprising a first estimator 302 configured to carry out the fourth step 104 and a second estimator 303, configured to carry out the fifth step 105. The dual estimator 301 further comprises an adaptation block 308 for carrying out the sixth step 106. In addition to the dual estimator 301, an ageing block, or SoH estimation block, in the form of a third estimator 307 is provided, configured to carry out the seventh step 107.

As measurement data relating to current I, voltage V and temperature T are collected, the data are fed to the dual estimator 301 and used by the first estimator 302 as well as by the second estimator 303. The first non-linear observer of the first estimator 302 is used to estimate values of the state vector x(t) base on the equivalent circuit model, while the second non-linear observer of the second estimator 303 is used to track fast changes around the nominal values $Q^*$, $R^*$, $OCV^*$ of the capacity Q, the resistance R and the open circuit voltage OCV using a random walk model. The state vector x(t) is continuously fed from the first estimator 302 to the second estimator 303, while the parameter vector θ(t) is fed from the second estimator 303 to the first estimator 302. The adaptation block 308 adaptively adjusts the tuning parameters of the first and second non-linear observers, respectively, based on the measurement data. This is typically carried out using stochastic analysis of measurement residuals, i.e. based on differences between the measurement data and predicted values of V and T as based on the equivalent circuit model.

The dual estimator 301 outputs data including the parameter vector θ(t) and the state vector x(t) to the third estimator 307 at a certain frequency or time interval. Generally, data is fed to the third estimator 307 at a much lower frequency than an updating frequency of the dual estimator 301 itself. The output from the dual estimator 301 may also be downsampled prior to feeding to the third estimator 307, or alternatively inside the third estimator 307. Furthermore, the measurement data relating to current I, voltage V and temperature T are also fed to the third estimator 307 and historical measurement data from measurements made during a defined time horizon are stored as a historical data set, i.e. a trajectory. The trajectory together with the parameter vector θ(t) and the state vector x(t) received from the dual estimator 301 are in the third estimator 307 used by an optimization based estimation scheme, such as a moving horizon estimation model, to estimate nominal values $Q^*$, $R^*$, $OCV^*$ of the capacity Q, the resistance R and the open circuit voltage OCV, respectively. The estimated nominal values are fed back to the dual estimator 301.

Figure 4:
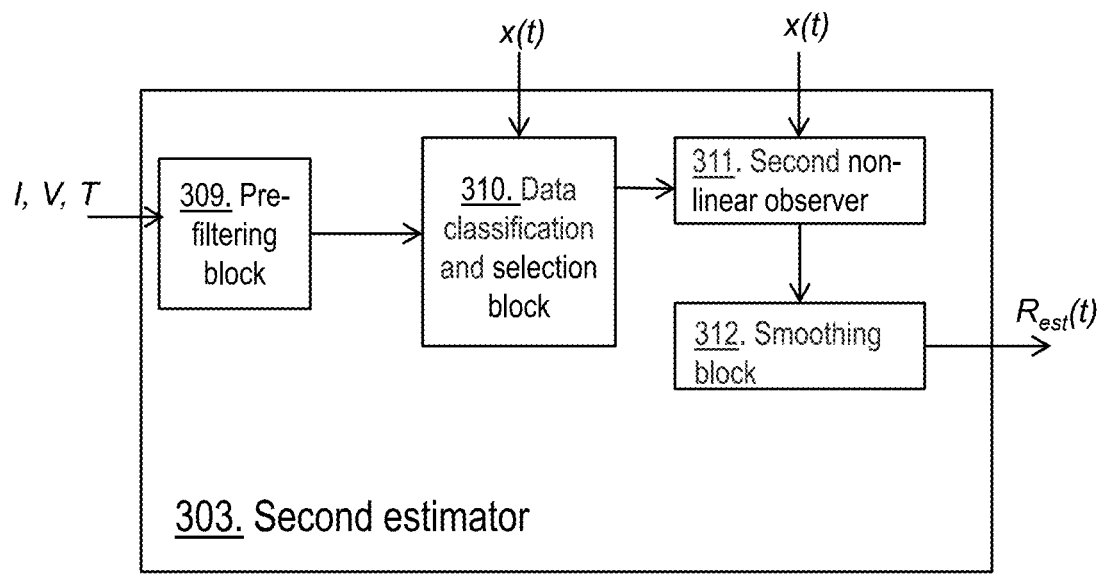
FIG. 4 is another block diagram illustrating steps of a method according to an embodiment of the invention.

FIG. 4 is a block model illustrating an embodiment of the second estimator 303. A pre-filtering block 309 is provided, to which the measurement data relating to I, V, and T are fed. In the pre-filtering block, the collected measurement data are filtered to remove high-frequency noise. Filtered operational data relating to I, V, and T, and also the estimated internal state vector x(t) from the first estimator 302, or elements thereof such as the internal voltage losses $V_i$, are thereafter fed to a data classification and selection block 310, in which the second step 102 is carried out, and which will be explained in further detail below. As explained above, the second estimator comprises at least one second non-linear observer illustrated by a block 311. Data relating to the internal state as a function of time, x(t), are provided from the first estimator 302 to the second non-linear observer 311, wherein values of the parameter vector θ(t)=[$R_0(t)$, $R_i(t)$, $C_i(t)$, $\tau_i(t)$], or rather fast changes around nominal values of these, are estimated. The estimated values are output to a smoothing block 312, in which e.g. low pass filtering, moving average filtering, or Kalman filtering, is used to smooth the trajectories and thereby improve the quality of all parameter estimates, for example an improved estimated resistance $R_{est}(t)$.

Figure 5:
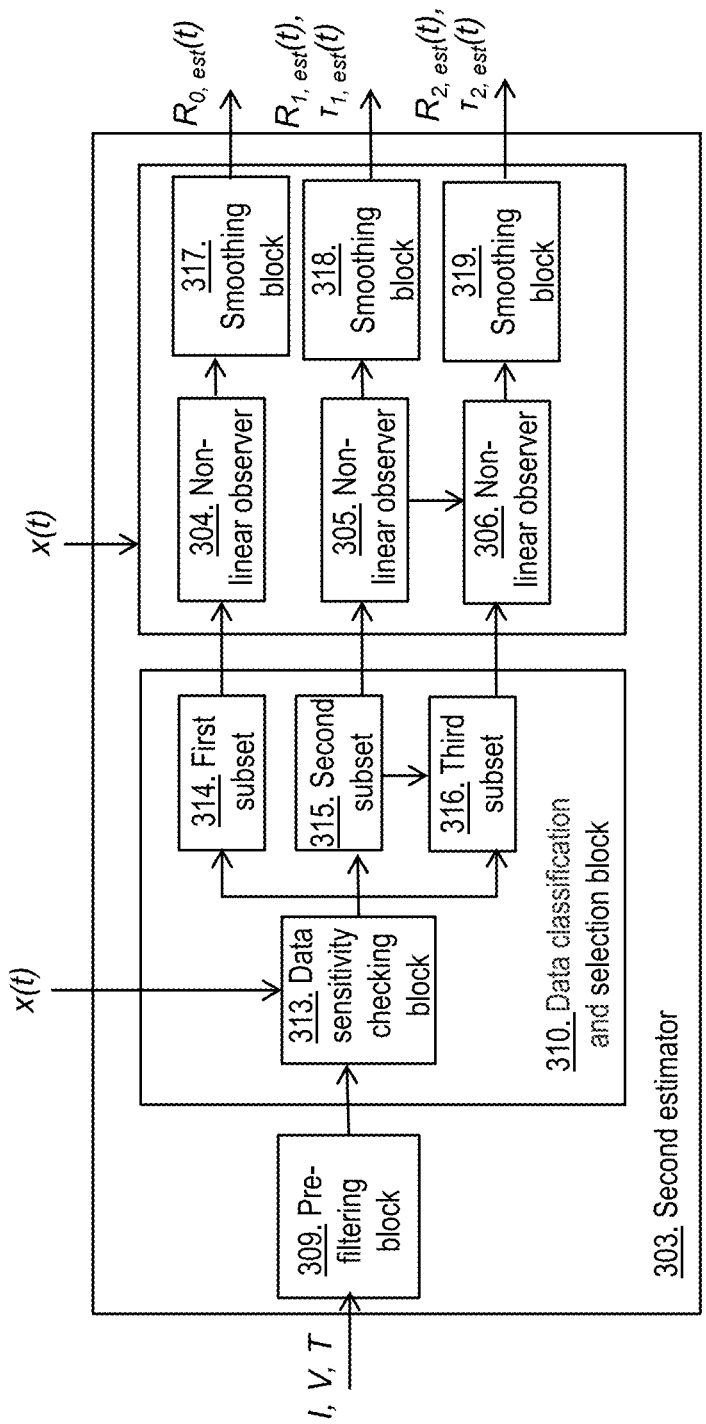
FIG. 5 is another block diagram illustrating steps of a method according to an embodiment of the invention.

FIG. 5 is a block model illustrating in further detail an embodiment of the second estimator 303, wherein the second estimator 303 comprises a plurality of non-linear second observers 304, 305, 306. In this case, the data classification and selection block 310 comprises a data sensitivity checking block 313, in which it is determined in the second step 102 whether the obtained operational data from the pre-filtering block 309 and the estimated internal state vector x(t) obtained from the first estimator 302, or elements thereof such as the internal voltage losses $V_i$, fulfil a defined sensitivity criterion with respect to a sensitivity of the obtained operational data and of the estimated internal state vector x(t), or elements thereof such as the internal voltage losses $V_i$, to each of the battery parameters to be estimated. The sensitivities may for example be obtained online by computing partial derivatives (so-called Jacobians) of the operational data and the internal voltage losses $V_i$ with respect to each parameter. The sensitivity check may then, for example, be performed by testing the obtained sensitivities against pre-defined suitable thresholds.

The set of battery parameters are thereafter partitioned into n+1 data subsets, wherein n is the number of RC branches: a first subset 314 comprising data for which the sensitivity criterion with respect to the internal resistance $R_0$ is fulfilled, a second subset 315 comprising data for which the sensitivity criterion with respect to the parameters of the first RC-branch is fulfilled, a third subset 316 for which the sensitivity criterion with respect to the parameters of the second RC-branch is fulfilled, and so on. Of course, the number of subsets may vary and different criteria may be used to partition data into subsets. For example, one or two different subsets may be used for parameters of each RC branch. In case of a model having two RC branches, as illustrated in FIG. 5, one subset may be used for the static resistance $R_0$, one of the time dependent parameters $R_1$ and $\tau_1$ of the first RC branch, and another one for the time dependent parameters $R_2$ and $\tau_2$ of the first RC branch. Generally, it is useful to partition data such that data sensitive to battery parameters varying on different timescale are stored in different subsets.

For each battery parameter for which the sensitivity criterion is fulfilled, a value of said battery parameter is estimated based on the obtained operational data and on output from the first estimator 302, and based on the current nominal value of the battery parameter. The observer 304 is used to estimate the internal static resistance $R_0$ using data from the first subset 314, the observer 305 is used to estimate the resistance $R_1$ and the time constant $\tau_1=R_1(t)C_1(t)$ of the first RC-branch using data from the second subset 315, and the observer 306 is used to estimate the resistance $R_2$ and the time constant $\tau_2=R_2(t)C_2(t)$ of the second RC-branch using data from the third subset 316. Smoothing of the respective parameter trajectories is carried out using smoothing blocks 317, 318, 319, obtaining estimated time dependent functions $R_{0,est}(t), R_{1,est}(t), \tau_{1,est}(t) R_{2,est}(t), \tau_{2,est}(t)$, forming part of the parameter vector $\theta(t)$.

The battery state, e.g. SoC or SoH, as estimated by the method may be used to e.g. predict the amount of power that the ESS is able to deliver during the coming time period, such as during the coming 30 s, or to predict the remaining driving range of the ESS, or to predict when the ESS or battery unit(s) thereof need(s) to be replaced. The estimated battery state may e.g. be communicated to an electronic control unit of the vehicle, such as an engine control unit (ECU). The drivetrain of the vehicle may be controlled based on the mentioned predictions.

The control functionality of the example embodiments may be implemented using existing computer processors, or by a special purpose computer processor for an appropriate system, incorporated for this or another purpose, or by a hardwire system. Embodiments within the scope of the present disclosure include program products comprising machine-readable medium for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

It is to be understood that the present invention is not limited to the embodiments described above and illustrated in the drawings; rather, the skilled person will recognize that many changes and modifications may be made within the scope of the appended claims.

The invention claimed is:

1. A method, performed by a control unit, for estimating a battery state of an energy storage system of a vehicle using at least a dual estimator, wherein the energy storage system comprises at least one battery unit, and wherein the dual estimator comprises:
   a first estimator comprising a first non-linear observer, the first estimator being configured to estimate at least one battery state of the energy storage system using a prediction model, the first estimator having first tuning parameters,
   a second estimator comprising at least one second non-linear observer, the second estimator being configured to track changes around nominal values of a set of battery parameters of the energy storage system, the second estimator having second tuning parameters, a first feedback loop being provided between the first and second estimators so that output from the first estimator is used as input to the second estimator and vice versa,
the method comprising, by the control unit:
   obtaining, from a sensor unit, operational data of the energy storage system by collecting measurement data relating to operating conditions of the energy storage system,
   determining whether the obtained operational data fulfil a defined sensitivity criterion with respect to a sensitivity of the obtained operational data to at least one of the battery parameters,
   feeding the obtained operational data to the first and the second estimators, respectively,
   using the first estimator, estimating the at least one battery state based on at least the obtained operational data and output from the second estimator,
   using the second estimator, for each battery parameter for which the sensitivity criterion is fulfilled, estimating a change around the nominal value of said battery parameter based on the obtained operational data and on output from the first estimator
   controlling a drivetrain of the vehicle based on the estimated battery state.

2. The method according to claim 1, wherein the second estimator comprises a plurality of said second non-linear observers, wherein each one of said second non-linear observers is used to estimate a change around the nominal value of at least one battery parameter from said set of battery parameters.

3. The method according to claim 2, wherein at least one of said second non-linear observers is used to estimate changes around the nominal values of at least two of said battery parameters varying at the same timescale.

4. The method according to claim 1, further comprising:
   for each battery parameter for which the sensitivity criterion is not fulfilled, setting a value of said battery parameter to its present value.

5. The method according to claim 1, wherein the method further comprises at least one of the steps of:
   adaptively adjusting at least one of the first and the second tuning parameters to account for fast timescale variations of the at least one battery state and/or the set of battery parameters arising due to varying operating conditions of the energy storage system, and adaptively adjusting the nominal values of the set of battery parameters to account for slow timescale variations arising due to ageing of the at least one battery unit.

6. The method according to claim 5, wherein the step of adaptively adjusting at least one of the first and the second tuning parameters is carried out based on at least the obtained operational data.

7. The method according to claim 5, wherein the step of adaptively adjusting the nominal values of the set of battery parameters to account for slow timescale variations comprises using a third estimator comprising a third non-linear observer, wherein a second feedback loop is provided between the dual estimator and the third estimator, so that output from the dual estimator is used as input to the third estimator and vice versa.

8. The method according to claim 7, wherein the step of adaptively adjusting the nominal values of the set of battery parameters to account for slow timescale variations comprises the steps of:
  storing the obtained operational data from measurements made during at least a defined time horizon to provide a historical data set,
  providing output from the dual estimator to the third estimator,
  using the third estimator, estimating the nominal value of at least one battery parameter based on the historical data set and on the output from the dual estimator,
  outputting the estimated nominal value of the at least one battery parameter from the third estimator to the dual estimator,
  wherein the estimated nominal value of the at least one battery parameter is used by the second estimator.

9. The method according to claim 8, further comprising downsampling of said output from the dual estimator, wherein said nominal value is estimated based on the downsampled output.

10. The method according to claim 7, wherein the estimation of said nominal value using the third estimator is carried out at a lower frequency than the estimations using the dual estimator, such as at a pre-determined lower frequency or after a pre-determined time interval or upon fulfilment of a defined condition.

11. The method according to claim 7, wherein the third estimator uses an optimization based estimation scheme, such as a moving horizon estimation model.

12. The method according to claim 1, wherein obtaining operational data of the energy storage system further comprises pre-filtering of the collected measurement data to remove high-frequency noise.

13. The method according to claim 1, wherein at least one of the non-linear observers is a Kalman filter, or a recursive least square method based observer, or a particle filter, or a sliding-mode observer.

14. A non-transitory computer program readable medium carrying a computer program comprising program code for performing the method according to claim 1 when said program code is run on a computer.

15. A control unit configured to perform the method according to claim 1.

16. A battery management system for an energy storage system comprising the control unit according to claim 15.

17. A vehicle comprising an energy storage system and a control unit according to claim 15.

* * * * *